United States Patent [19]

Dellantonio

[11] 4,232,560
[45] Nov. 11, 1980

[54] KEYBOARD FOR THE PRESELECTION OF ELECTROMAGNETIC SIGNALS

[75] Inventor: Ezio F. Dellantonio, Rome, Italy

[73] Assignee: Autovox, SpA, Rome, Italy

[21] Appl. No.: 849,739

[22] Filed: Nov. 9, 1977

[30] Foreign Application Priority Data

Nov. 11, 1976 [IT] Italy ................. 52129 A/76

[51] Int. Cl.³ .......................................... F16H 35/18
[52] U.S. Cl. ................... 74/10.33; 74/10.31; 74/10.37
[58] Field of Search ............... 74/10.31, 10.33, 10.37, 74/10.39; 334/7; 200/5 G

[56] References Cited

U.S. PATENT DOCUMENTS

| | | | |
|---|---|---|---|
| 2,217,066 | 10/1940 | Manning | 74/10.33 |
| 2,424,845 | 7/1947 | Plensler | 74/10.33 |
| 3,247,728 | 4/1966 | Wolf | 74/10.33 |
| 3,602,051 | 8/1971 | Olak | 74/10.35 |
| 3,863,509 | 2/1975 | Zimatore | 74/10.33 |
| 3,906,806 | 9/1975 | Harlan | 74/10.33 |
| 3,943,779 | 3/1976 | Ganderton | 74/10.35 |
| 4,120,207 | 10/1978 | Dellantonio | 74/10.33 |
| 4,133,214 | 1/1979 | Cicala | 74/10.31 |
| 4,141,254 | 2/1979 | Spakman | 74/10.39 |

*Primary Examiner*—Charles J. Myhre
*Assistant Examiner*—Magdalen Moy
*Attorney, Agent, or Firm*—Phillip H. Melamed; James W. Gillman

[57] ABSTRACT

A pushbutton (keyboard) tuning apparatus for a radio receiver is disclosed. The apparatus comprises a flat tuning key carrying an adjustable and lockable tuning cam means (plunger) which is guided in a slot in the tuning key and locked into position by applying force to an appendage forming part of said slot. Slideable end caps are positioned on each tuning key and each cap carries a pin for selectively applying the force to the locking appendage. Each cap also carries a resilient tongue for actuating clutch disengagement of a manual rotary knob tuning apparatus having a shaft axially displaceable for releasing any pushbuttons previously depressed and being held in their depressed condition.

26 Claims, 8 Drawing Figures

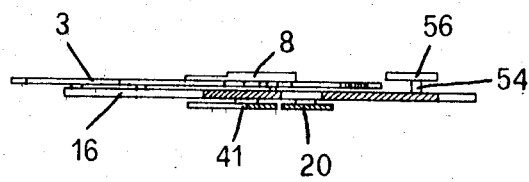
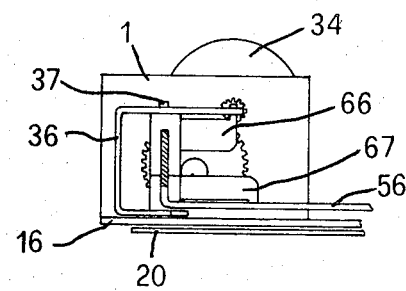
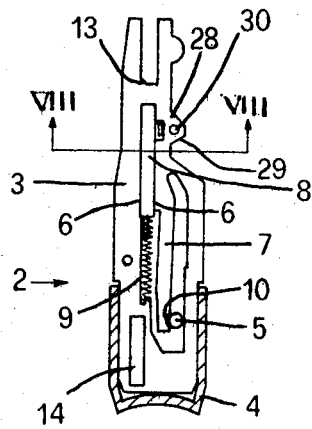
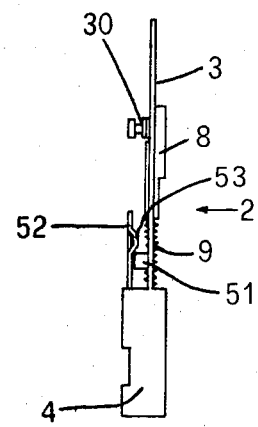
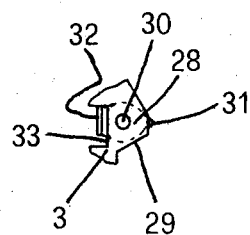
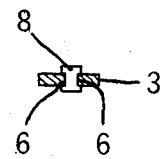

KEYBOARD FOR THE PRESELECTION OF ELECTROMAGNETIC SIGNALS

CROSS REFERENCE TO RELATED APPLICATIONS

The present Application hereby claims the priority for all common subject matter disclosed in prior U.S. Patent Application Ser. No. 731,331, filed Oct. 12, 1976 (now U.S. Pat. No. 4,120,207), which was pending when the present Application was filed.

BACKGROUND OF THE INVENTION

Pushbutton tuning keyboards are known for preselecting electromagnetic signals, wherein a frame carries a tuning system which is operable either by means of a conventional rotary manual knob tuning mechanism provided with a disengageable clutch means or by means of a number of pushbutton keys, each having stored thereon a predetermined position to be imparted to the tuning system. One such tuning system comprises a tuning slider that is longitudinally slideably reciprocable with respect to the frame and whose position determines the selection of electromagnetic radio signals. The tuning slider is provided with a number of slots and a number of elbow levers are pivoted on the frame and each elbow lever has one end coacting with one slot of the tuning slider. An adjustable means selectively engaging the other end of each of said elbow levers is provided on each of said pushbutton keys, the keys being slideably guided on the frame at right angles to the movement of the tuning slider, the keys also being reciprocably moveable between an extracted rest position and a retracted operative position in which operative position the adjustable means imparts a preselected rotation to the corresponding elbow lever and thereby a preselected longitudinal movement to said tuning slider. Such a pushbutton keyboard tuning system is described in a copending U.S. patent application, Ser. No. 731,331 assigned to the same assignee as the present invention.

SUMMARY OF THE INVENTION

The present invention relates to an improvement of the pushbutton keyboard tuning system described above, by which one can obtain the advantages of reducing the space required, improving the precision and reliability of the tuning system and reducing the cost of manufacturing such a system.

According to the present invention there is provided a pushbutton keyboard tuning system for the tuning preselection of electromagnetic signals comprising a frame with means adapted to guide a number of keys for preselecting signals, a tuning memorization latch whose position determines the selection of electromagnetic signals, a key positioning bar for selectively maintaining each of said keys in at least an operative inserted position and a nonoperative extracted position, a slider for controlling clutch disengagement of said latch to a rotary knob tuning mechanism, and in which each key comprises end of stroke stop means adapted to position the key at a predetermined position with respect to the frame in said operative position of said key, a plunger on each key adapted to selectively position the tuning memorization latch, means to lock the plunger in a predetermined position on each key and means movable with each key for acting on the slider controlling clutch disengagement, and an improvement wherein each key comprises a flat slider portion provided with guide means for said plunger and provided with a resilient appendage forming part of said guide means and operable to selectively lock the position of said plunger.

A new key has been provided with a base or slider manufactured from a single flat cut-out piece comprising the guide for the adjustable cam tuning means (plunger), adapted to engage a tuning element bar, and a resilient appendage engageable by a pin disposed in an end cap of the key is provided in order to lock the plunger into a predetermined position. A movable pawl is also provided on the key slider to engage a position retaining bar of the keys during the movement of the key towards an inserted position but not during the keys return movement to an extracted or rest position, so as to ensure the release of any other key which may be in its inserted position upon positioning one key into its inserted position, notwithstanding relatively large manufacturing tolerances of the keys. By permitting relatively large tolerances, a considerable cost saving is achieved in the manufacture of the entire keyboard. The keys are slideably guided in contact with the frame and the arresting torque at the end of the manual key stroke is minimized and transferred to end of stroke pins which retain the keys in the frame. This in turn leads to a reduction in the possibility of deformation of the pins and the plunger and a corresponding increase in the overall realiability of the keyboard.

BRIEF DESCRIPTION OF DRAWINGS

An embodiment of the present invention will now be described by way of example only and with reference to the accompanying drawings, in which:

FIG. 3 is a view in cross section along the line III—III of the keyboard tuning system of FIG. 1;

FIG. 4 is a view from the back of a manual tuning unit which is part of the tuning system of FIG. 1;

FIG. 5 is a plane view from above, with some parts in cross section, of a pushbutton key of the pushbutton keyboard of FIG. 1;

FIG. 6 is a side view of the pushbutton key of FIG. 5;

FIG. 7 is an enlarged view of a detail of the pushbutton key of FIG. 5; and

FIG. 8 is a view in cross section along the line VIII—VIII of the pushbutton key of FIG. 5.

DESCRIPTION OF THE PREFERRED EMBODIMENT

Figure 1:
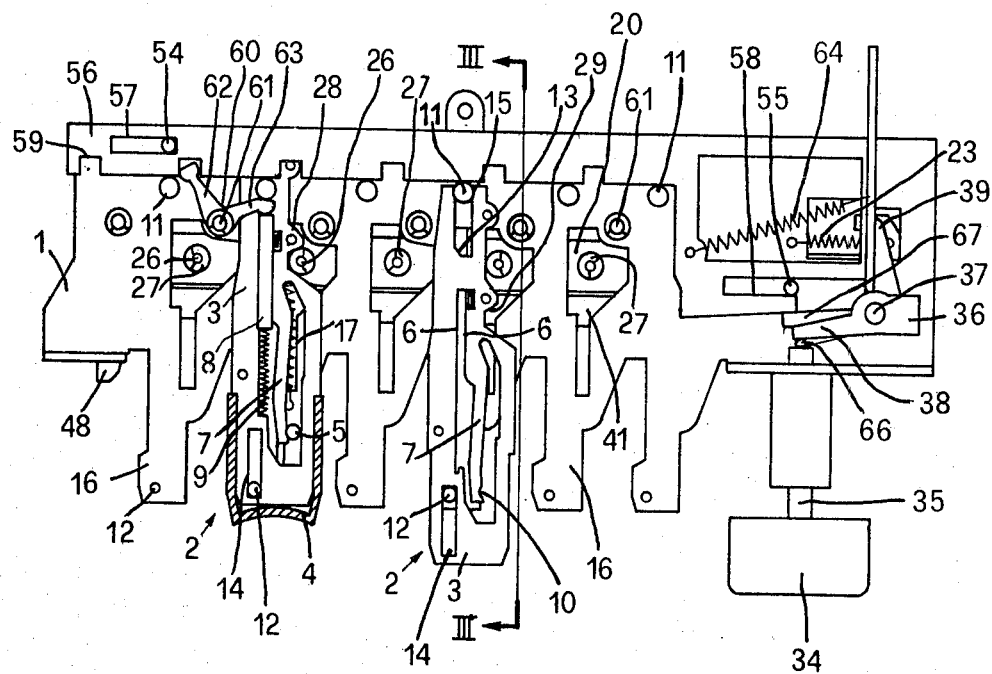
FIG. 1 is a partial view from above with parts in cross section of a pushbutton keyboard tuning system constructed according to the present invention.

Initially, the detailed structure of the preferred embodiment of the invention will be discussed and subsequently the operation of the structure will be discussed. Identical reference numbers are used in all of the drawings to designate identical components. With reference to the accompanying drawings, the present pushbutton keyboard tuning system comprises a frame 1 in the form of a flat plate having a number of pushbutton keys 2 (six in this embodiment) attached to the upper part of the flat plate and slideable transversely with respect to the frame 1.

Each pushbutton key 2 comprises a base or slider 3, a cap 4, and a pin 5 attached to the cap 4. The cap 4 can longitudinally move with respect to the slider 3 into an inserted position as shown in the figures, and into an extracted (not shown) and the pin 5 prevents the cap 4 from slipping off the slider 3.

The slider 3 is formed by a single cut-out piece of flat plate material in which a guide 6 is formed having a resilient appendage 7 on one of its sides forming part of the guide 6.

A plunger 8 with lateral grooves is inserted in the guide 6 so as to be capable of longitudinal movement with respect to the slider 3 and the plunger 8 is biased by a spring 9 towards a position away from the cap 4.

The plunger 8 can be adjustably locked into a predetermined position by applying pressure against the resilient appendage 7 so as to constrict the guide 6. This is done by the pin 5 when the cap 4 is pushed inward into its inserted position in which the pin 5 engages a notch 10 in the elastic appendage 7. When the cap 4 is in its extracted position the pin 5 does not engage the notch 10 and the appendage 7 does not constrict the guide 6.

The frame 1 has a number of pins 11 and 12 which cooperate respectively with slots 13 and 14 formed in each slider 3 to guide the keys 2 in their movements. The pins 11 are provided with heads 15. Each head 15 on one side of the slider 3 and the cap 4 on the other side in cooperation with an appendage 16 of the frame 1 which the cap surrounds prevent each slider 3 from leaving the frame 1. A spring 17 biases each key 2 into an extracted or inoperative position.

Figure 2:
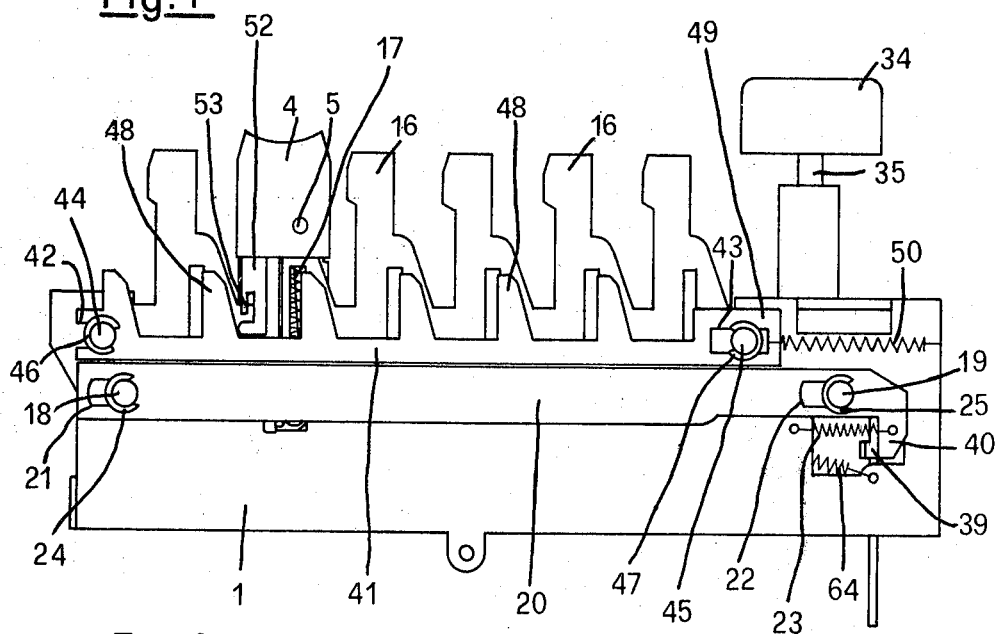
FIG. 2 is a view from below with some parts removed from the keyboard tuning system of FIG. 1.

Two pins 18 and 19 (see FIG. 2) are disposed on the frame 1 and project downward and a tie bar 20, provided with slots 21 and 22 which cooperate respectively with the pins 18 and 19, is movable transversely with respect to the movement of the keys 2 against the action of a bias spring 23. The tie bar 20 is kept in contact with the lower part of the frame 1 by two spring clips 24 and 25 fixed respectively to the pins 18 and 19.

The tie bar 20 carries a number of pins 26 facing upwardly (See FIG. 1), and a small roller 27 is fitted on each pin 26 so as to be able to rotate freely around it. Each small roller 27 cooperates with a cam 28 of each key 2 in order to keep the key 2 in an inserted and operative position once it has been depressed manually. The key 2 shown in FIG. 1 on the left side is shown in its inserted operative position and the key 2 shown on the right side of FIG. 1 is shown in its extracted inoperative position.

A V shaped portion of the inner part of the slot 13 and the fact that the roller 27 urges the key 2 along an inclined part 29 of the cam 28 under the action of the spring 23 makes it possible for the key 2 to assume an inserted position well-defined with respect to the frame inasmuch as any play between the pins 11 and 12 and the slots 13 and 14 is taken up by the elastic force exerted by the roller 27 on the cam 28.

Each key 2 carries a pin 30 and a pawl 3 (see FIG. 7) which is free to rotate or pivot about the pin 30 an oscillates between the two positions determined by the abutment of an upstanding tail 32 of the pawl 31 against the sides of a notch 33 recessed in the slider 3.

When a key 2 is moved from its extracted position inward toward its operative position the pawl 31 is disposed against the roller 27 and pushes the roller away from and beyond the edge of the cam 28 to insure the release of any other key 2 which is in the inserted position. This occurs because during the outward movement of a key 2 the pawl 31 pivots under the action of the roller 27 and therefore the pawl 31 will permit the spring 17 of a key 2 to release the key and return the key to its extracted nonoperative position. In essence the pawls 31 on each key 2 insure that the tire bar 20 which carries the rollers 27 is moved far enough to release any other previously depressed key. In this way the usual tolerances in the manufacture of components will not prevent the release of an inserted key, via the action of its spring 17, upon the manual insertion of any other key.

On the frame 1 there is also fixed a conventional rotary knob·continuous tuning control unit in which a rotary knob 34 controls by its rotation the displacement of a tuning slide mechanism.

The knob 34 is not only rotatable, but also is axially movable inward together with a shaft 35 having one end on which the knob 34 is mounted. A lever 36 with two arms 38 and 39 is pivotally mounted to the frame 1 by a pivot pin 37. The arm 38 of the lever 36 selectively engages a free end of the shaft 35 opposite to the end on which the knob 34 is mounted while the other arm 39 of the lever 36 cooperates with a projection 40 (see FIG. 2) of the tie bar 20.

By depressing the knob 34 inward in an axial direction, the arm 39 moves tie bar 29 against the action of the spring 23 and in this way any key 2 which is in the operative position is freed.

A slider 41 has two slots 42 and 43 and is disposed beneath the frame 1 and guided by two pins 44 and 45 fixed to the frame and projecting downward and cooperating with the slots 42 and 43. The slider 41 is maintained close to the frame by two spring clips 46 and 47 fixed to the pins 44 and 45, respectively.

The slider 41 has six projections 48 of generally triangular shape and one end 49 of the slider 41 is connected to a conventional clutch device (not shown) for the control knob 34. The slider 41 is urged by a spring 50 in a direction which tends to keep the clutch device engaged so that the knob 34 will control the movement of a tuning slide mechanism.

On each slider 3 there is a downwardly projecting pin 51 (see FIG. 6), and each cap 4 carries a resilient tongue 52 with a raised protuberance 53 which engages with the pin 51 when the cap 4 is extracted, thereby lowering the resilient tongue 52.

With the cap 4 in its inserted position on the key 2 (as shown in FIGS. 5 and 6), the tongue 52 engages one of projections 48 when a key 2 is moved towards its operative position. This results in pushing the slider 41 against the action of the spring 50 and therefore releasing the clutch device (see FIG. 2).

Conversely, if a key 2 is pushed towards its operative position with the cap 4 in its extracted position, the tongue 52 will be disposed in a plane displaced with respect to its respective projection 48 so that engagement between the two elements will not be possible and the clutch will remain engaged.

A slidable tuning memorization latch 56, generally being flat bar shaped and whose position determines the selection of electromagnetic signals, has two slots 57 and 58 which cooperate, respectively, with two pins 54 and 55 provided on frame 1 to guide the latch 56 with respect to the frame 1. Two spacers slipped over the pins 54 and 55 keep the latch slightly lifted with respect to the frame 1 so that it does not obstruct the movement of the keys 2.

One end of the latch 56 is connected to a conventional tuning slider mechanism, such as a moveable plate which controls the position of inductor tuning cores. This end is also connected to the rotary knob 34 clutch device which, when the clutch is engaged, allows the movement of the latch 56 by means of the tuning knob 34 despite any biasing force of the spring 64, while when the clutch is disengaged, the latch 56 is free to move regardless of the position of the rotary knob 34, but the latch is still subject to the force of the spring 64. As already mentioned, the release of the clutch takes place through the movement of the slider 41.

The latch 56 has six notches 59. Six elbow levers 60 each have their centers slipped over separate pins 61 that are joined to the frame 1 and the elbows 60 are rotatable around the pins 61. An end of one arm 62 of the levers 60 is inserted in each notch 59 of the latch 56, while an end of another arm 63 of the levers 60 is adapted to abut against the plunger 8 of a corresponding key 2 when the key is in its operative position.

A spring 64 subjects the latch 56 to a bias force having a component which biases the latch 56 in a direction so as to keep the arm 63 of the lever 60 in contact with the plunger 8 of a key in its operative position, while a force component perpendicular to the former takes up the play between the slots 57 and 58 and the corresponding pins 54 and 55.

A lever 65 with two arms made of resilient material is pivoted on the pin 37 on which the lever 36 is pivoted. One arm 66 of the lever 65 bears against the free end of the shaft 35 while another arm 67 of the lever 65 bears against the latch 56. In this way when the knob 34 is pressed, the latch 56 will remain fixed in its position and the spring 64 will be prevented from returning the latch to an end of the stroke position.

The operation of the pushbutton keyboard tuning system of the present invention will now be discussed in detail.

Operation of tuning system by means of the manual knob 34 will now be discussed:

The operation of the tuning system may be implemented by rotating the knob 34 and thereby displacing the latch 56 and an associated core tuning plate mechanism by any desired amount. This will occur if no keys 2 are in their inward operative position. Depressing the knob 34 causes a displacement of the tie bar 20, via lever 36, and therefore disengages any key 2 which is in its operative position and which, under the action of its own spring 17, will therefore return to its nonoperative rest position. With all the keys 2 in their rest positions, the slider 41 will assume its rest position under the action of the spring 50 so that the clutch for knob 34 will be engaged and, upon rotating the knob 34, the core tuning slide mechanism and latch 56 will be moved into a position for tuning to any desired broadcast transmission of electromagnetic radio signals. The spring 64 will not move the tuning slide mechanism during the release of the keys 2 when the knob 34 is depressed because of the action of the two arms 66 and 67 of the lever 65. Also, after depressing and then releasing the knob 34, the spring 64 has no appreciable effect on the latch position because with the clutch engaged, the clutch device is irreversible, i.e., the latch 56 can be shifted only by turning the knob 34.

Tuning to a predetermined radio transmission station by depressing any one of the keys 2 will now be discussed:

By manually depressing any "preselected" key 2 inward towards its operative position, "preselected" means any key 2 whose plunger 8 is locked by the cap 4 being in its inserted position, the tongue 52 of the key 2 will engage the corresponding projection 48 of the slider 41 and open the clutch. As the key 2 moves further towards its operative position, the pawl 31 of the key will engage the corresponding roller 27 of the tie bar 20 causing the disengagement of any other key which may be in its operative position.

Having pushed a key 2 fully into its operative position by abutting the key against the corresponding pin 11, the key is kept in this position by the action of the roller 27 on the cam 28 and the latch 56 will be displaced according to the position of the plunger 8 with respect to the key, and the latch 56 is kept in this position by the spring 64.

The position of the slider 3 of a key does not depend on the force exerted on the key, as is the case in the usual pushbutton keyboards, because the end of the stroke of the key 2 is referenced to the frame by means of the slots 13 and the corresponding pin 11, and the force exerted on the key 2 is transmitted to the frame which prevents any deformation of the mechanism of the slider 3.

Preselecting a key so as to select a desired radio transmitting station will now be discussed:

Initially it is necessary to tune to the transmitting station by means of the manual rotary knob 34. Having performed this operation, the keys 2 will all be in their inoperative positions. After choosing a key to preselect the desired transmitting station, the cap 4 of the desired key is moved to its extracted position thereby freeing the plunger 8 of the key.

With the cap 4 in its extracted position, the small tongue 52 is unable to act on the corresponding projection 48 of the slider 41 which controls the clutch mechanism.

Now the key 2 is depressed towards its operative position by manually acting on the cap 4. The spring 17 is more yieldable than the resilient appendage 7 and therefore the key moves into its operative position with the cap 4 still in its extracted position. During this movement, the clutch remains engaged because the small tongue 52 is offset with respect to the slider 41 and consequently since the clutch is engaged the latch 56 remains fixed. As a consequence, the plunger 8 is positioned by the latch 56 in an exact position with respect to the key corresponding to the position of the latch 53. Further inward pressure on the cap 4 will not cause any further displacement of the slider 3 of the key, but will cause the pin 5 to shift the resilient appendage 7 until the pin 5 is inserted in the notch 10 and the cap 4 is in its inserted position with the plunger 8 fixed in a position corresponding to the desired station.

Also, during preselection tuning operation the force exerted manually on the key is transmitted to the frame and does not cause any deformation of the tuning mechanism. The only force which really acts on the latch 56 is that of the spring 9 of the plunger 8, and this force is only of a small magnitude and above all is constant regardless of how forcefully the key is depressed.

Once a key is preselected in this way, the key allows tuning to the chosen station at any time through its movement from its non-operative rest position to its operative position, as already stated.

While I have shown and described specific embodiments of this invention, further modifications and improvements will occur to those skilled in the art. All such modifications which retain the basic underlying principles disclosed and claimed herein are within the scope of this invention.

I claim:

1. A pushbutton keyboard tuning system for the tuning preselection of electromagnetic signals comprising:
   a frame with means adapted to guide a number of keys for preselecting signals,
   a tuning memorization latch whose position determines the selection of electromagnetic signals,
   a key positioning bar for selectively maintaining each of said keys in at least an operative inserted position and a non-operative extracted position,
   a slider for controlling clutch disengagement of said latch to a rotary knob tuning mechanism,
   and in which each key comprises end of stroke stop means adapted to position the key at a predetermined position with respect to the frame in said operative position of said key,
   a plunger linearly slidable on each key adapted to selectively position the tuning memorization latch,
   means to lock the plunger in a predetermined slidable position on each key which determines the position of said tuning memorization latch when said key is in its operative inserted position, and means moveable with each key for acting on the slider controlling clutch-disengagement, and an improvement wherein,
   each key comprises a flat slider portion provided with guide means for slidably guiding said plunger and provided with a resilient appendage forming part of said guide means and operable to selectively lock the slidable position of said plunger.

2. A keyboard tuning system according to claim 1, in which each key comprises a cap which is moveable between an extracted position and an inserted position with respect to said slider portion and a pin attached to said cap for engaging said resilient appendage in the inserted position of the cap to lock the plunger in a predetermined position.

3. A pushbutton keyboard tuning system for the tuning preselection of electromagnetic signals comprising:
   a frame with means adapted to guide a number of keys for preselecting signals,
   a tuning memorization latch whose position determines the selection of electromagnetic signals,
   a key positioning bar for selectively maintaining each of said keys in at least an operative inserted position and a non-operative extracted position,
   a slider for controlling clutch disengagement of said latch to a rotary knob tuning mechanism,
   and in which each key comprises end of stroke stop means adapted to position the key at a predetermined position with respect to the frame in said operative position of said key,
   a plunger on each key adapted to selectively position the tuning memorization latch,
   means to lock the plunger in a predetermined position on each key and means moveable with each key for acting on the slider controlling clutch-disengagement, and an improvement wherein,
   each key comprises a flat slider portion provided with guide means for said plunger and provided with a resilient appendage forming part of said guide means and operable to selectively lock the position of said plunger,
   each key comprises a cap which is moveable between an extracted position and an inserted position with respect to said slider portion and a pin attached to said cap for engaging said resilient appendage in the inserted position of the cap to lock the plunger in a predetermined position,
   each moveable cap of the key carries a small resilient tongue which cooperates with the clutch disengagement control slider in the inserted position of the cap, and the slider portion of the key is provided with a pin which offsets said elastic tongue with respect to the clutch slider when the cap is in its extracted position.

4. A keyboard tuning system according to claim 2, in which the frame is provided with appendages for each key and the cap of each key surrounds one of said appendages.

5. A pushbutton keyboard tuning system for the tuning preselection of electromagnetic signals comprising:
   a frame with means adapted to guide a number of keys for preselecting signals,
   a tuning memorization latch whose position determines the selection of electromagnetic signals,
   a key positioning bar for selectively maintaining each of said keys in at least an operative inserted position and a non-operative extracted position,
   a slider for controlling clutch disengagement of said latch to a rotary knob tuning mechanism,
   and in which each key comprises end of stroke stop means adapted to position the key at a predetermined position with respect to the frame in said operative position of said key,
   a plunger on each key adapted to selectively position the tuning memorization latch,
   means to lock the plunger in a predetermined position on each key and means moveable with each key for acting on the slider controlling clutch-disengagement, and an improvement wherein,
   each key comprises a flat slider portion provided with guide means for said plunger and provided with a resilient appendage forming part of said guide means and operable to selectively lock the position of said plunger, and
   said frame comprises a flat plate and guide means for each key are formed by two pins cooperating with respective grooves formed on said flat slider portion.

6. A keyboard tuning system according to claim 5, in which at least one of the two pins guiding each key is provided with a head to maintain the key in contact with the frame.

7. A pushbutton keyboard tuning system for the tuning preselection of electromagnetic signals comprising:
   a frame with means adapted to guide a number of keys for preselecting signals,
   a tuning memorization latch whose position determines the selection of electromagnetic signals,
   a key positioning bar for selectively maintaining each of said keys in at least an operative inserted position and a non-operative extracted position,
   a slider for controlling clutch disengagement of said latch to a rotary knob tuning mechanism,
   and in which each key comprises end of stroke stop means adapted to position the key at a predetermined position with respect to the frame in said operative position of said key,
   a plunger on each key adapted to selectively position the tuning memorization latch, means to lock the plunger in a predetermined position on each key and means moveable with each key for acting on the slider controlling clutch-disengagement, and an improvement wherein,
   each key comprises a flat slider portion provided with guide means for said plunger and provided with a resilient appendage forming part of said guide means and operable to selectively lock the position of said plunger, guide means for the bar for positioning the keys are formed by two pins joined to the frame and cooperating with respective slots formed in said bar.

8. A pushbutton keyboard tuning system for the tuning preselection of electromagnetic signals comprising:

a frame with means adapted to guide a number of keys for preselecting signals, a tuning memorization latch whose position determines the selection of electromagnetic signals, a key positioning bar for selectively maintaining each of said keys in at least an operative inserted position and a non-operative extracted position, a slider for controlling clutch disengagement of said latch to a rotary knob tuning mechanism, and in which each key comprises end of stroke stop means adapted to position the key at a predetermined position with respect to the frame in said operative position of said key, a plunger on each key adapted to selectively position the tuning memorization latch, means to lock the plunger in a predetermined position on each key and means moveable with each key for acting on the slider controlling clutch-disengagement, and an improvement wherein, each key comprises a flat slider portion provided with guide means for said plunger and provided with a resilient appendage forming part of said guide means and operable to selectively lock the position of said plunger, and means coupled to the rotary knob tuning mechanism for returning each key to its inoperative extracted position and these means comprise a lever having two arms pivoted to the frame, one arm of which is operable by a shaft of the rotary knob tuning mechanism when the shaft is moved in an axial direction, and the other arm of which cooperates with a projection of the bar for maintaining the position of the keys.

9. A keyboard tuning system according to claim 8 wherein said shaft, upon inward axial movement, releases each of said keys into its extracted position.

10. A keyboard tuning system according to claim 9, in which resilient means are provided for engaging said tuning memorization latch when the shaft of said knob tuning mechanism is axially displaced in position inwardly.

11. A pushbutton keyboard tuning system for the tuning preselection of electromagnetic signals comprising:

a frame with means adapted to guide a number of keys for preselecting signals, a tuning memorization latch whose position determines the selection of electromagnetic signals, a key positioning bar for selectively maintaining each of said keys in at least an operative inserted position and a non-operative extracted position, a slider for controlling clutch disengagement of said latch to a rotary tuning mechanism, and in which each key comprises end of stroke stop means adapted to position the key at a predetermined position with respect to the frame in said operative position of said key, a plunger on each key adapted to selectively position the tuning memorization latch, means to lock the plunger in a predetermined position on each key and means moveable with each key for acting on the slider controlling clutch-disengagement, and an improvement wherein, each key comprises a flat slider portion provided with guide means for said plunger and provided with a resilient appendage forming part of said guide means and operable to selectively lock the position of said plunger, and each of said key slider portions carries a rotatable pawl means which insures the release of the other key slider portions into non-operative positions upon the movement of one key slider portion into an operative position from a non-operative position.

12. A keyboard tuning system according to claim 11 wherein said rotatable pawl on each key pivots from a first position of engagement with said positioning bar of the keys during movement of the key towards its operative position to a second position of disengagement with said bar during the movement of the key towards its inoperative position.

13. A pushbutton tuning apparatus having a presettable and lockable linearly slidable cam means on each of a plurality of pushbuttons for selectively positioning a tuning control means in accordance with the slidable position of said cam means, wherein each pushbutton comprises:

a flat slider portion provided with guide means for slidably guiding the cam means and provided with a resilient appendage forming part of said guide means and operable to selectively lock the cam means in a predetermined position.

14. A pushbutton tuning apparatus according to claim 13, in which each pushbutton comprises an external end cap which can be moved between an extracted position and an inserted position with respect to said flat slider portion and a pin attached to said cap for engaging said resilient appendage in the inserted position of the cap to lock the cam means in a predetermined position.

15. A pushbutton tuning apparatus according to claim 14, wherein when each of said caps is positioned in its extracted position, said cam means is freely settable.

16. A pushbutton tuning apparatus having a presettable and lockable cam means on each of a plurality of pushbuttons for selectively positioning a tuning control means wherein each pushbutton comprises:

a flat slider portion provided with guide means for the cam means and provided with a resilient appendage forming part of said guide means and operable to selectively lock the cam means in a predetermined position, each pushbutton also comprises an external end cap which can be moved between an extracted position and an inserted position with respect to said flat slider portion and a pin attached to said cap for engaging said resilient appendage in the inserted position of the cap to lock the cam means in a predetermined position, wherein when each of said caps is positioned in its extracted position, said cam means is freely settable, each moveable cap of the key carries a small resilient tongue which cooperates with a clutch disengagement control slider for a rotary tuning mechanism in the inserted position of the cap, and the pushbutton is provided with a pin to offset said elastic tongue with respect to the clutch slider when the cap is in its extracted position.

17. A pushbutton tuning apparatus having a presettable and lockable cam means on each of a plurality of pushbuttons for selectively positioning a tuning control means wherein each pushbutton comprises:

a flat slider portion provided with guide means for the cam means and provided with a resilient appendage forming part of said guide means and operable to selectively lock the cam means in a predetermined position, said pushbutton tuning apparatus including a frame comprising a flat plate and guide means for each pushbutton are formed by two pins cooperating with respective grooves on each of said flat slider portions.

18. A pushbutton tuning apparatus according to claim 17, in which at least one of the two pins guiding each pushbutton is provided with a head to maintain the pushbutton in contact with the frame.

19. A pushbutton tuning apparatus having a presettable and lockable cam means on each of a plurality of pushbuttons for selectively positioning tuning control means wherein each pushbutton comprises:

a flat slider portion provided with guide means for the cam means and provided with a resilient appendage forming part of said guide means and operable to selectively lock the cam means in a predetermined position, said pushbutton tuning apparatus including end of stroke means attached to said frame for defining the maximum inward movement of said pushbuttons.

20. A pushbutton tuning apparatus having a presettable and lockable cam means on each of a plurality of pushbuttons for selectively positioning tuning control means wherein each pushbutton comprises:

a flat slider portion provided with guide means for the cam means and means for selectively locking the cam means in a predetermined position, each pushbutton comprises an external end cap which can be moved between an extracted position and an inserted position with respect to said flat slider portion and a pin means attached to said cap for engaging said selective locking means in the inserted position of the cap to lock the cam means in a predetermined position, wherein when each of said caps is positioned in its extracted position, said cam means is freely settable, each moveable cap of the key carries a small resilient tongue which cooperates with a clutch disengagement control slider for a rotary tuning mechanism in the inserted position of the cap, and the pushbutton is provided with a pin to offset said elastic tongue with respect to the clutch slider when the cap is in its extracted position.

21. A pushbutton keyboard tuning system for the tuning preselection of electromagnetic signals comprising:

a frame with means adapted to guide a number of keys for preselecting signals, a tuning memorization latch whose position determines the selection of electromagnetic signals, a key positioning bar for selectively maintaining each of said keys in at least an operative inserted position and a non-operative extracted position, a slider for controlling clutch disengagement of said latch to a rotary tuning mechanism, and in which each key comprises end of stroke stop means adapted to position the key at a predetermined position with respect to the frame in said operative position of said key, a plunger on each key adapted to selectively position the tuning memorization latch, means to selectively lock the plunger in a predetermined position on each key and means moveable with each key for acting on the slider controlling clutch-disengagement, and an improvement wherein, each key comprises a flat slider portion provided with guide means for said plunger, each key comprises a cap which is moveable between an extracted position and an inserted position with respect to said slider portion and a pin attached to said cap for engaging said selective locking means in the inserted position of the cap to lock the plunger in a predetermined position, each moveable cap of the key carries a small resilient tongue which cooperates with the clutch disengagement control slider in the inserted position of the cap, and the slider portion of the key is provided with a pin which offsets said elastic tongue with respect to the clutch slider when the cap is in its extracted position.

22. A pushbutton keyboard tuning system for the tuning preselection of electromagnetic signals comprising;

a frame with means adapted to guide a number of keys for preselecting signals, a tuning memorization latch whose position determines the selection of electromagnetic signals, a key positioning bar for selectively maintaining each of said keys in at least an operative inserted position and a non-operative extracted position, means for controlling clutch disengagement of said latch to a rotary knob tuning mechanism which selectively positions said latch by rotary motion of said rotary knob tuning mechanism, and in which each key comprises end of stroke stop means adapted to position the key at a predetermined position with respect to the frame in said operative position of said key, a plunger on each key adapted to selectively position the tuning memorization latch, means to lock the plunger in a predetermined position on each key and means moveable with each key for acting on the means controlling clutch disengagement, and means coupled to the rotary knob tuning mechanism for returning each key to its inoperative extracted position and these means comprise a lever having two arms pivoted to the frame, one arm of which is operable by a shaft of the rotary knob tuning mechanism when the shaft is moved in an axial direction, and the other arm of which cooperates with a projection of the bar for maintaining the position of the keys.

23. A keyboard tuning system according to claim 22 wherein said shaft, upon inward axial movement, releases each of said keys into its extracted position.

24. A keyboard tuning system according to claim 23, in which resilient means are provided for engaging said tuning memorization latch when the shaft of said rotary knob tuning mechanism is axially displaced in position inwardly.

25. A pushbutton keyboard tuning system for the tuning preselection of electromagnetic signals comprising:

a frame with means adapted to guide a number of keys for preselecting signals, a tuning memorization latch whose position determines the selection of electromagnetic signals, a key positioning bar for selectively maintaining each of said keys in at least an operative inserted position and a non-operative extracted position, a slider for controlling clutch disengagement of said latch to a rotary knob tuning mechanism, and in which each key comprises end of stroke stop means adapted to position the key at a predetermined position with respect to the frame in said operative position of said key, a plunger on each key adapted to selectively position the tuning mechanism latch, means to lock the plunger in a predetermined position on each key and means moveable with each key for acting on the slider controlling clutch-disengagement, and an improvement wherein, each key comprises a flat slider portion provided with guide means for said plunger and provided with means for selectively locking the position of said plunger, each of said key slider portions carries a rotatable pawl means which insures the release of other key slider portions into non-operative positions upon the movement of one key slider portion into an operative position from a non-operative position.

26. A keyboard tuning system according to claim 25 wherein said rotatable pawl on each key pivots from a first position of engagement with said positioning bar of the keys during movement of the key towards its operative position to a second position of disengagement with said bar during the movement of the key towards its inoperative position.

* * * * *

UNITED STATES PATENT AND TRADEMARK OFFICE
CERTIFICATE OF CORRECTION

PATENT NO. : 4,232,560

DATED : November 11, 1980

INVENTOR(S) : Ezio F. Dellantonio

It is certified that error appears in the above—identified patent and that said Letters Patent is hereby corrected as shown below:

Column 11, line 66, insert --knob-- after "rotary".

Column 12, line 56, add --ing-- to "position".

Signed and Sealed this

First Day of September 1981

[SEAL]

Attest:

GERALD J. MOSSINGHOFF

Attesting Officer

Commissioner of Patents and Trademarks